United States Patent [19]

Dargatz

[11] Patent Number: 5,121,079
[45] Date of Patent: Jun. 9, 1992

[54] DRIVEN-COMMON ELECTRONIC AMPLIFIER

[76] Inventor: Marvin R. Dargatz, 2327 Pinnacles Dr., Rocklin, Calif. 95677

[21] Appl. No.: 654,051
[22] Filed: Feb. 12, 1991
[51] Int. Cl.$^5$ .............................................. H03F 3/45
[52] U.S. Cl. ..................................... 330/258; 330/261
[58] Field of Search ............... 330/252, 258, 261, 246, 330/297, 301, 311

[56] References Cited

U.S. PATENT DOCUMENTS 4,162,456  7/1979  Lukes ........................ 330/258 X
4,206,416  6/1980  Kellogg ...................... 330/258 X
4,241,428  12/1980  Berni et al. ................. 330/258 X

*Primary Examiner*—Steven Mottola

[57] ABSTRACT

Sampled input, common mode driven, differential amplifier. Both inputs to a differential amplifier are sampled with a high input impedance amplifier. These signals are then summed and used to drive a buffer amplifier. The output of the buffer amplifier then drives the floating common node of a floating power supply. The floating power supply powers the main differential amplifier.

1 Claim, 2 Drawing Sheets

DRIVEN-COMMON AMP.

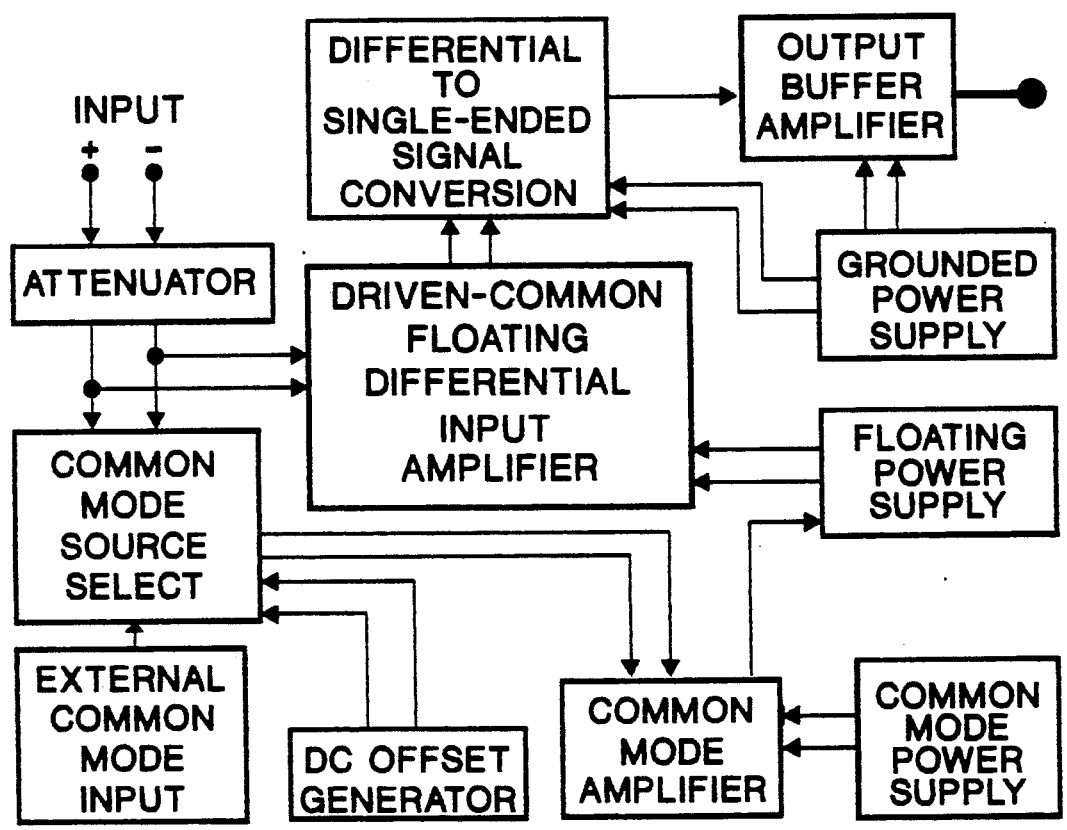
FIG.1 DRIVEN-COMMON AMP.

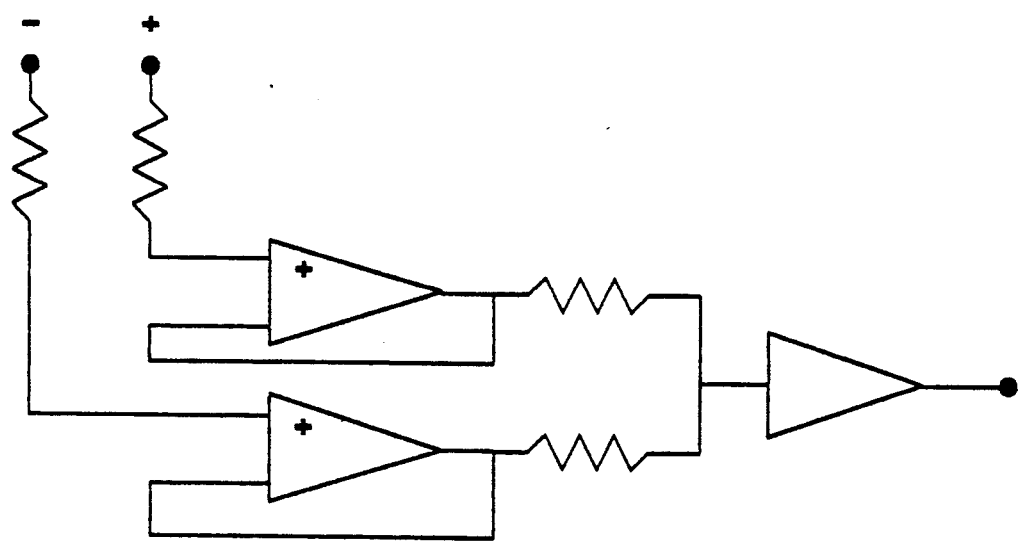
FIG. 2. COMMON MODE AMP.

DRIVEN-COMMON ELECTRONIC AMPLIFIER

BACKGROUND

1. Field of Invention

This invention relates to electronic signal measurement amplifiers, specifically to an improved means to common-mode signal rejection in differential amplifiers.

2. Description of Prior Art

Heretofore most differential amplifiers have been ground referenced, said amplifiers are prone to saturation, exhibiting relatively limited dynamic range and common-mode rejection capability.

A differential amplifier scheme employing the Driven-Common Electronic Amplifier circuit will exhibit the high sensitivity and Common Mode Rejection Ratio required to measure to measure very small signals, even though those signals are embedded in a vastly larger common mode signal. In addition, higher voltages and dynamic ranges are tolerated by the overall amplifier scheme without saturation effects.

OBJECTS AND ADVANTAGES

Accordingly several objects and advantages of my invention are the Driven-Common Amplifier takes a sample of the input signal prior to the main amp, feeds it to a common mode amplifier, which then drives the common (reference) of the floating power supply which is providing power to the main amp.

This allows the main amplifier sensitivity to be high enough to measure very small differential signals, even though those signals are floating on a much higher common mode signal. An example would be a 5 volt logic signal floating on a 220 volt AC power system.

A differential amplifier scheme employing the Driven-Common Electronic Amplifier circuit will exhibit the high sensitivity and Common Mode Rejection Ratio required to measure to measure very small signals, even though those signals are embedded in a vastly larger common mode signal. In addition, higher voltages and dynamic ranges are tolerated by the overall amplifier scheme without saturation effects.

Further objects and advantages of my invention will become apparent from a consideration of the drawings and ensuing description of it.

DESCRIPTION OF DRAWINGS

FIG. 1. Driven-common Electronic Amplifier Block Diagram.

This drawing presents the concept in functional block form, as it is implemented by the inventor in the DA100 instrumentation amp by Signal Acquisition Technologies.

FIG. 2. Driven-common Electronic Amplifier Schematic.

A simplified schematic of the common mode amplifier as implemented in the DA100 product of Signal Acquisition Technologies.

STRUCTURE

The Driven-common Floating Differential Input Amplifier is a standard configuration differential amplifier. Said amplifier is powered from a floating power supply. The common (reference) lead of said floating power supply is driven by the output of the Common Mode Amplifier. The "Common Mode Amp" consists of two voltage followers, a resistor summing network, and a buffer amplifier.

OPERATION

Simultaneously, a differential signal is applied to the Driven-common Floating Differential Input Amplifier (a conventional differential configuration) and a sample of the incoming differential signal is applied to the Common Mode Amplifier (detailed in FIG. 2.) The Common Mode Amplifier sums the signal (resulting in a time averaged value) and applies it to a buffer (to drive the common to earth ground capacitance), which drives the common lead of the Floating Power Supply. The Floating Power Supply powers the Driven-common Floating Differential Input Amplifier.

Alternatively, a DC offset can be applied to the Common Mode Amplifier. This is useful if the signal of interest is embedded on a DC power supply voltage. As a second alternative, an external signal can be applied to the Common Mode Amplifier. This would only be of advantage if the signal was the "pure" common mode signal. For example, with 5 volt logic floating on a power line, the pure power line signal is applied to the Common Mode amplifier.

The Driven-common Floating Differential Input Amplifier is powered by a floating power supply. The Common Mode Amplifier is powered by a conventional grounded power supply.

The input signal to the Driven-common Floating Differential Input Amplifier is processed in a conventional manner, and is eventually converted to a single ended signal for input to an oscilloscope, frequency counter, DMM, etc.

The effect of this scheme is to keep the main amplifier from saturating and to increase its effective input dynamic range. A good example would be a 5 volt logic signal floating on a 220 volt AC power source (this is common in motor controls and Traveling Wave Tube applications). The main amplifier can be powered from a floating +/− volt power supply. The 5 volt input signal is within said amplifier's dynamic range, and driving the common of the floating power supply keeps the 220 volt AC portion of the signal from overdriving, saturating, and damaging the main differential amplifier.

My invention is realized as part of the Signal Acquisition Technologies DA100 differential amplifier product.

SCOPE OF INVENTION

Thus the reader will see that the common mode voltage processing approach of the invention provides a novel method for increasing the dynamic operating range of differential amplifiers and comparators. While my above description contains many specificities, these should not be construed as limitations on the scope of my invention, but as a preferred emboniment thereof. Other variations are possible.

I claim:

1. A driven-common electronic amplifying circuit comprising:
   a main amplifying circuit of standard differential configuration, and
   a common-mode amplifying circuit consisting of two voltage-following circuits, a resistor-summing network circuit, and a buffer amplifying circuit, and
   a floating power supply circuit connected to and powering said main amplifying circuit, and
   the output of said common-mode amplifying circuit connected to and driving the common-reference lead of said floating power supply circuit,
   whereby said main amplifying circuit is prevented from saturating and effective input dynamic range is increased.

* * * * *